United States Patent [19]
Ziger

[11] Patent Number: 5,968,690
[45] Date of Patent: Oct. 19, 1999

[54] THIN FILM THICKNESS AND OPTIMAL FOCUS MEASURING USING REFLECTIVITY

[75] Inventor: David H. Ziger, San Antonio, Tex.

[73] Assignee: VSLI Technology, Inc., San Jose, Calif.

[21] Appl. No.: 08/843,537

[22] Filed: Apr. 18, 1997

Related U.S. Application Data

[62] Division of application No. 08/613,892, Mar. 11, 1996.

[51] Int. Cl.$^6$ ........................................................ G03F 9/00
[52] U.S. Cl. .................................................. 430/30
[58] Field of Search .................................................. 430/30

[56] References Cited

U.S. PATENT DOCUMENTS

| | | | |
|---|---|---|---|
| 4,680,084 | 7/1987 | Heimann et al. | 156/626 |
| 5,452,091 | 9/1995 | Johnson | 356/445 |

Primary Examiner—Christopher G. Young
Attorney, Agent, or Firm—Wagner, Murabito & Hao LLP

[57] ABSTRACT

A method and system for measuring the thickness of a patterned film. In one embodiment, a first patterned film is impinged with electromagnetic radiation having a wavelength which varies within a given wavelength range. The electromagnetic radiation reflected from the first patterned film is measured. The thickness of the first patterned film is then measured using thickness measuring equipment. The determined thickness of the first patterned film is then correlated with the measured reflectance of the electromagnetic radiation from the first patterned film. A second patterned film is then impinged with electromagnetic radiation having a wavelength which varies within the given wavelength range. The electromagnetic radiation reflected from the second patterned film is measured. The present invention uses the previously determined correlation to determine the thickness of the second patterned film.

10 Claims, 7 Drawing Sheets

THIN FILM THICKNESS AND OPTIMAL FOCUS MEASURING USING REFLECTIVITY

This is a divisional of copending application(s) Ser. No. 08/613,892 filed on Mar. 11, 1996 which designated in the U.S.

TECHNICAL FIELD

The present claimed invention relates to the field of semiconductor device fabrication. More specifically, the present claimed invention relates to the determination of thin film thickness and optimal focal length.

BACKGROUND ART

Semiconductor manufacturing requires precisely measuring various features and parameters. Features which must be precisely measured include, for example, thin films. A thin film of photoresist which is too thick or too thin can dramatically affect the semiconductor manufacturing process. Similarly, a parameter such as the focal length of a lithographic semiconductor manufacturing apparatus dramatically affects the condition and reliability of elements created using the lithographic semiconductor manufacturing apparatus.

Some prior art thin film thickness measuring techniques are based upon UV reflectance spectroscopy. Prior Art FIG. 1 shows a reflection of light, typically shown as rays 10, incident to a homogenous, substantially semitransparent layer 12. Using prior art thin film measuring techniques, once the refractive index, $n_1$, of substantially semitransparent layer 12, and he refractive index, $n_2$, of substrate 14 are known, the film thickness $t_1$ of layer 12 can be determined. The thickness of semitransparent layer 12 is related to measured reflectivity as a function of wavelength, $\lambda$, via application of the Fresnel reflection formula:

$$R = \frac{r'^2 + r''^2 + 2r'r''\cos(4\pi n_1 t_1 / \lambda)}{1 + r'^2 + r''^2 + 2r'r''\cos(4\pi n_1 t_1 / \lambda)}$$

where:
$$r' = \frac{n_1 - n_{Air}}{n_1 + n_2}$$
$$r'' = \frac{n_2 - n_1}{n_2 + n_1}$$

Thus, prior art thin film thickness measuring methods require knowledge of the refractive index of the thin film being measured and the refractive index of the underlying substrate. The user must also know or calculate the real and imaginary components of indices of refraction. The refractive indices of the thin film and the underlying substrate are commonly determined using a given Cauchy coefficient. Therefore, if the refractive indices are not known, prior art thin film thickness measuring techniques require the user to have known the refractive indices of the thin film and an underlying layer before the thickness of thin film can be calculated. Furthermore, prior art thin film thickness measuring techniques employing reflectance spectroscopy require that the film being measured is not entirely absorptive.

Prior Art techniques such as the "pin-bars" technique also exist for measuring parameters such as the focal length of a lithographic semiconductor manufacturing apparatus. However, prior art focus measuring techniques are subjective. As a result, user error can cause a lithographic semiconductor manufacturing apparatus to be set at a focus which is not the optimal focus. Likewise, differences in perception between different users can cause variances between different lithographic semiconductor manufacturing apparati.

Thus, the need has arisen for a thin film thickness measuring system which does not require the user to know or calculate the refractive indices of the thin film or an underlying layer; and a focal length measuring system which allows for objectively and consistently selecting an optimal focal length.

DISCLOSURE OF THE INVENTION

It is therefore an object of the present invention to provide a thin film thickness measuring system which does not require the user to know or calculate the refractive indices of the thin film and an underlying layer; and a focal length measuring system which allows for objectively and consistently selecting an optimal focal length. The above object has been achieved by correlating reflectivity from a periodically patterned film to a known film thickness and by correlating reflectivity to an optimal focal length.

Specifically, in one embodiment, a first patterned film is impinged with electromagnetic radiation having a wavelength which varies within a given wavelength range. The electromagnetic radiation reflected from the first patterned film is measured. The thickness of the first patterned film is then measured using thickness measuring equipment. The determined thickness of the first patterned film is then correlated with the measured reflectance of the electromagnetic radiation from the first patterned film. A second patterned film is then impinged with electromagnetic radiation having a wavelength which varies within the given wavelength range. The electromagnetic radiation reflected from the second patterned film is measured. The present invention uses the previously determined correlation to determine the thickness of the second patterned film.

To correlate reflectivity to optimal focal length, a first periodic pattern is formed using a lithographic semiconductor manufacturing apparatus set at a first focal length. A second periodic pattern is formed using the lithographic semiconductor manufacturing apparatus set at a second focal length. Both the first periodic pattern and the second periodic pattern are impinged with electromagnetic radiation having a wavelength which varies within a wavelength range. The electromagnetic radiation reflected from the first and second periodic patterns is measured. The reflectance of electromagnetic radiation from the first and second periodic patterns are compared. The comparison of the measured reflectance is used to determine which of the first and second focal lengths optimizes the formation of features formed by the lithographic semiconductor manufacturing apparatus.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
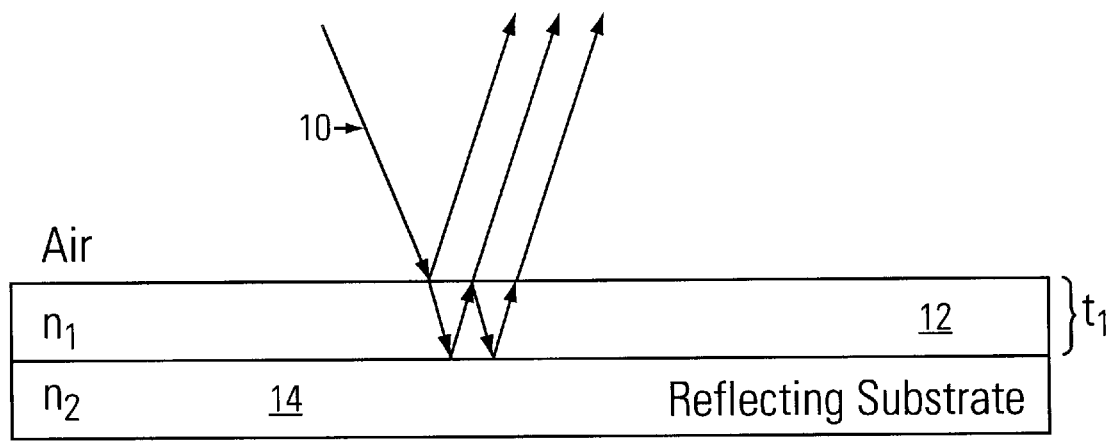
FIG. 1 is a schematic diagram illustrating a prior art thin film thickness measuring technique.
Figure 2:
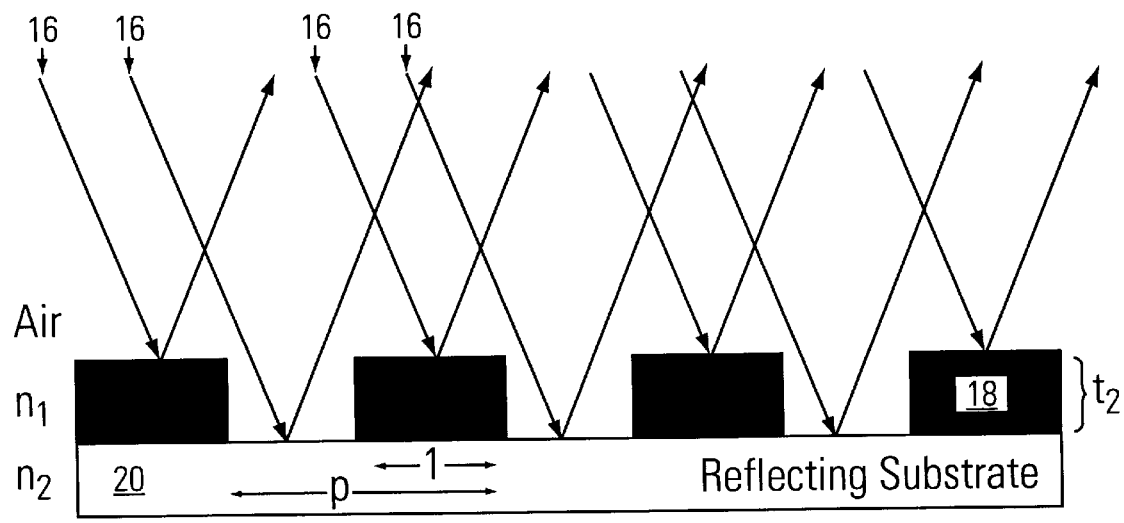
FIG. 2 is a schematic diagram illustrating a periodically patterned thin film disposed on a substrate wherein the thickness of the thin film is calculated in accordance with the present claimed invention.

With reference now to FIG. 2, a periodically patterned thin film 18 is disposed on a substrate 20. As shown in FIG. 2, periodically patterned substantially opaque layer 18 has a line width l and pitch p. Thus, each line of periodically patterned layer 18 is separated from adjacent lines by a distance of p-l. In the present embodiment, periodically patterned layer 18 is formed of resist, and substrate 20 is a bare silicon wafer. Although such materials and dimensions are used in the present embodiment, the present invention is also well suited to the use of other types of periodically patterned substantially opaque layers and substrates having different dimensions.

With reference still to FIG. 2, reflection of electromagnetic radiation rays, typically shown as 16, incident to homogenous, substantially opaque periodically patterned layer 18 is shown. The present invention determines the thickness $t_2$ of any periodically patterned substantially opaque layer 18 without requiring knowledge or calculation of the index of refraction of substantially opaque layer 18 or substrate 20. In the present embodiment, the electromagnetic radiation absorbing nature of substantially opaque layer 18 eliminates reflectivity at the interface of substrate 20 and substantially opaque layer 18 because electromagnetic radiation cannot penetrate substantially opaque layer 18. Furthermore, due to scattering, the reflectivity is dependent on both pitch, p, and line width, l, as well as other factors such as equipment responsiveness, optical properties of the underlying substrate, resist profiles and the like. For example, if the line is infinitely wide (i.e. substantially opaque layer 18 unpatterned), substrate 20 is completely covered by substantially opaque layer 18. Thus, reflectivity occurs only from the interface between the air and substantially opaque layer 18. On the other hand, if the distance p-l is infinitely large (i.e. substantially opaque layer 18 has been completely removed), then reflectivity occurs only from underlying substrate 20. However, reflection does occur at the interface between the air and substantially opaque layer 18 provided that the index of refraction of substantially opaque layer 18 is different than the index of refraction of air. Reflection further occurs at the interface between the air and substrate 20 provided that the wavelength, λ, of the incoming electromagnetic radiation is in the range of or less than the distance p-l. Furthermore, it will be understood by those of ordinary skill in the art, that other limitations such as the height of substantially opaque layer 18 in relation to the wavelength of the incoming electromagnetic radiation can also affect reflectivity.

Figure 3:
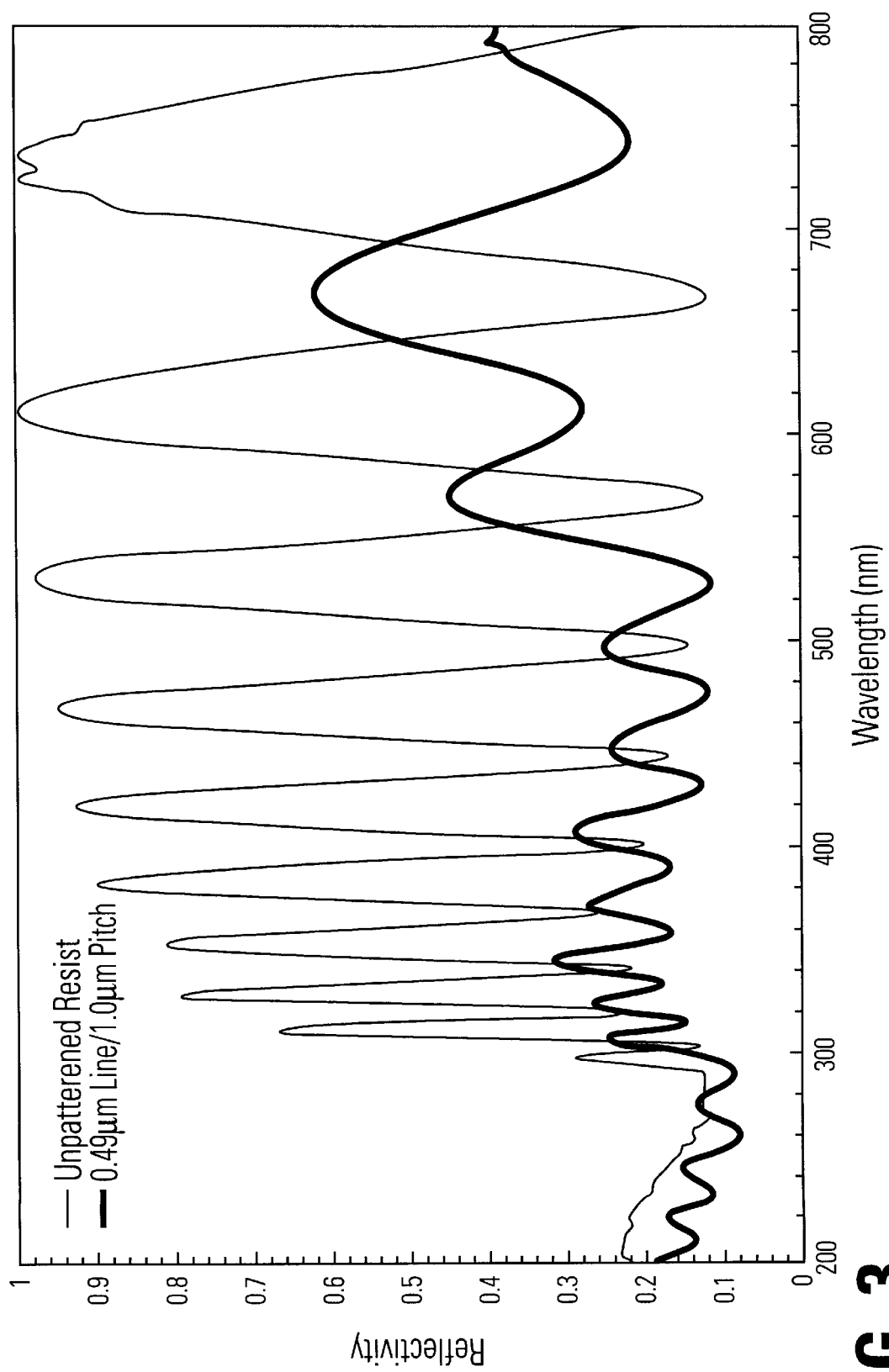
FIG. 3 is a graph showing the reflectivity of an unpatterned and a periodically patterned thin film versus the wavelength of impinging electromagnetic radiation.

With reference next to FIG. 3, a graph showing the reflectivity of an unpatterned and a patterned resist layer is shown. In the present embodiment, substantially opaque layer 18 of FIG. 2 is formed of resist having novolak-diazonaphthoquinone inhibitor chemistry. In the present embodiment, the resist is substantially opaque below 300 nanometers, and substantially transparent above 300 nanometers. Such optical characteristics are shown in the unpatterned resist of FIG. 3. As a result, substantially opaque layer 18 is highly absorptive of electromagnetic radiation having a wavelength in the deep ultraviolet (DUV) range due to the phenolic nature of the resist's backbone. For purposes of the present application, the DLTV range is defined as electromagnetic radiation having a wavelength between approximately 190 to 300 nanometers. As shown in FIG. 3, very slight reflectivity occurs for electromagnetic radiation having a wavelength range of approximately 200 to 300 nanometers for an unpatterned film, while a periodically patterned film provides a substantially sinusoidally varying standing wave.

Figure 4:
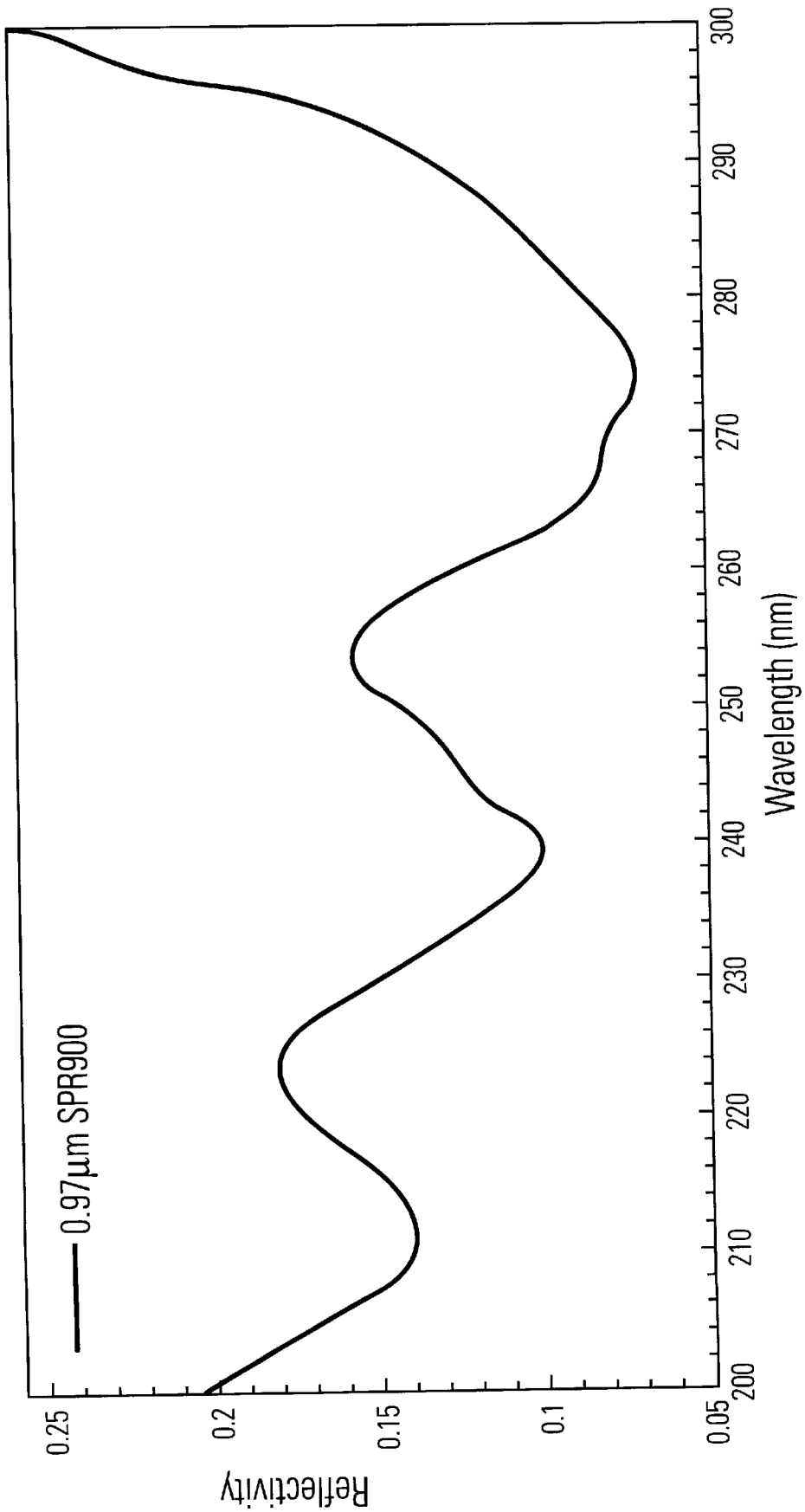
FIG. 4 is a graph showing reflectivity of a periodically patterned thin film versus the wavelength of impinging DUV light.

Referring next to FIG. 4, a graph showing reflectivity versus the wavelength of impinging DUV light is shown. In the present embodiment, a DUV generating electromagnetic source such as a deuterium lamp is used to impinge a periodically patterned substantially opaque layer with electromagnetic radiation. The reflectivity of the periodically patterned substantially opaque layer is measured across a wavelength range as shown in FIG. 4. In the present invention, an oscillatory reflectivity pattern is recorded. Although, a DUV absorptive resist is used in the present embodiment, the present invention is also well suited to the use of other types of resist or materials which are absorptive at other wavelengths. In instances where the material is absorptive at other wavelengths, an electromagnetic radiation source which produces a wavelength which will be absorbed is used. Similarly, the present invention is also well suited to using electromagnetic radiation having a wavelength which is not highly absorbed but is, instead, reflected by the periodically patterned layer, but which is absorbed by the underlying substrate. That is, the present invention requires that the periodically patterned layer and the underlying substrate differ in the degree to which incoming electromagnetic radiation is absorbed and reflected thereby.

Figure 5:
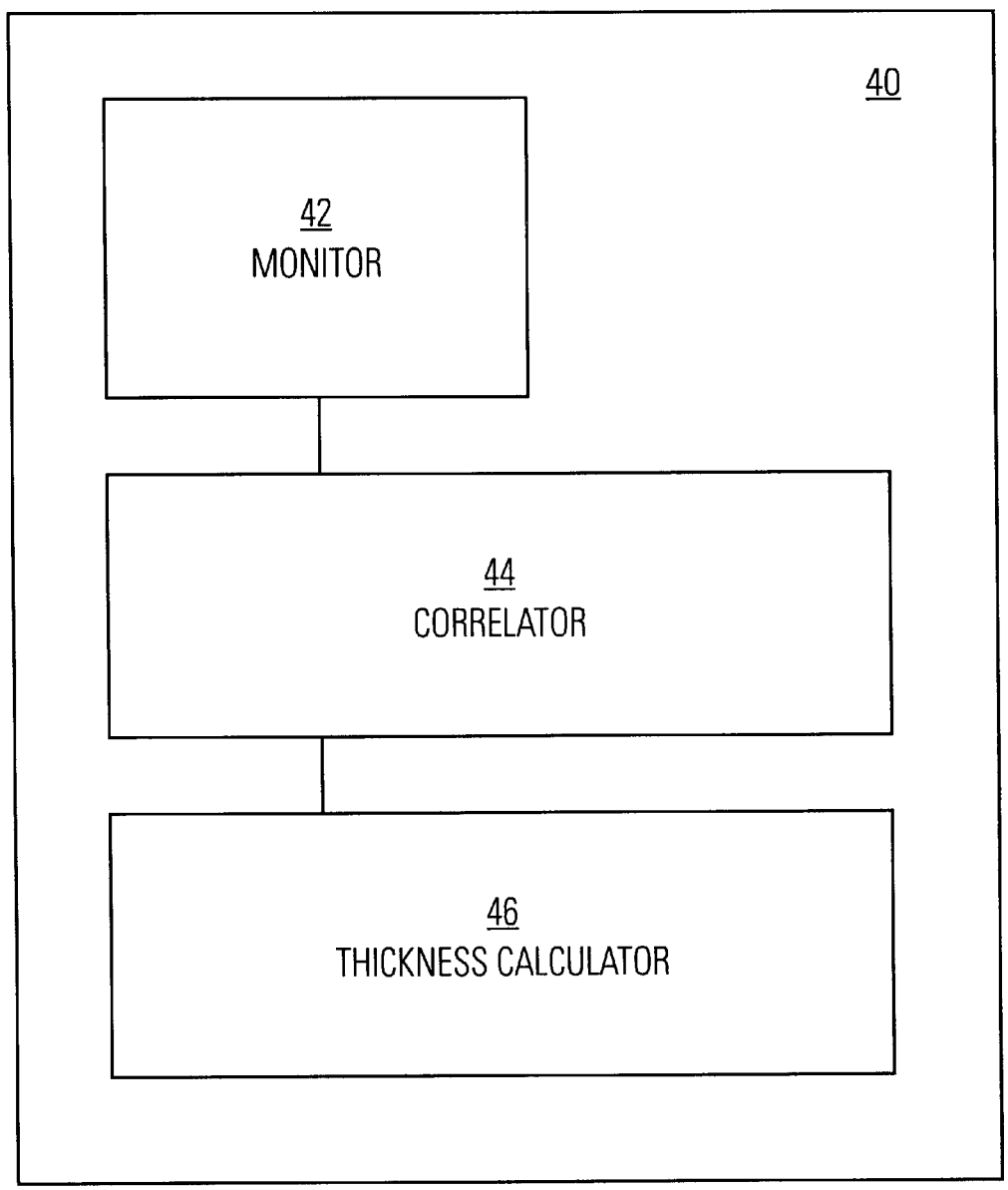
FIG. 5 is a schematic diagram of components used in accordance with the present invention.

With reference next to FIG. 5, a schematic diagram 40 of components used in accordance with the present invention is shown. The reflectivity of the periodically patterned substantially opaque layer is measured across a wavelength range using an electromagnetic radiation monitor 42. Such radiation devices are well known in the art and are available as off-the-shelf components. The oscillatory reflectivity pattern is then input to a correlator 44. The correlator correlates the measured oscillatory reflectivity pattern to the actual thickness of the substantially opaque layer being impinged by the DUV light. That is, in the present invention the thickness of at least one substantially opaque layer is measured using well known thickness measuring tools. In the present embodiment, the thickness of the substantially opaque layer is measured using an atomic force microscope such as are marketed by Veeco Instruments of Plainview, N.Y. Correlator 44 then correlates the known thickness to the measured oscillatory reflectivity pattern. In the present embodiment, correlator 44 fits the data points of the measured oscillatory reflectivity pattern in order to extract the period. First, correlator 44 removes baseline reflectance by regressing the measured oscillatory reflectivity pattern to a second order polynomial. Next, correlator 44 uses a nonlinear regression to fit residues from the polynomial regression to Acos(B/λ+C) where B increases as the period decreases. Although such an approach is used by correlator 44 in the present embodiment, the present invention is also well suited to using any of numerous techniques to closely fit the measured oscillatory reflectivity pattern to a functional relationship. Additionally, although the present invention employs a correlator 44, the present invention is also well suited to the use of other comparison approaches such as, for example, modeling of the reflectivity response to the thickness of the substantially opaque layer.

Figure 6:
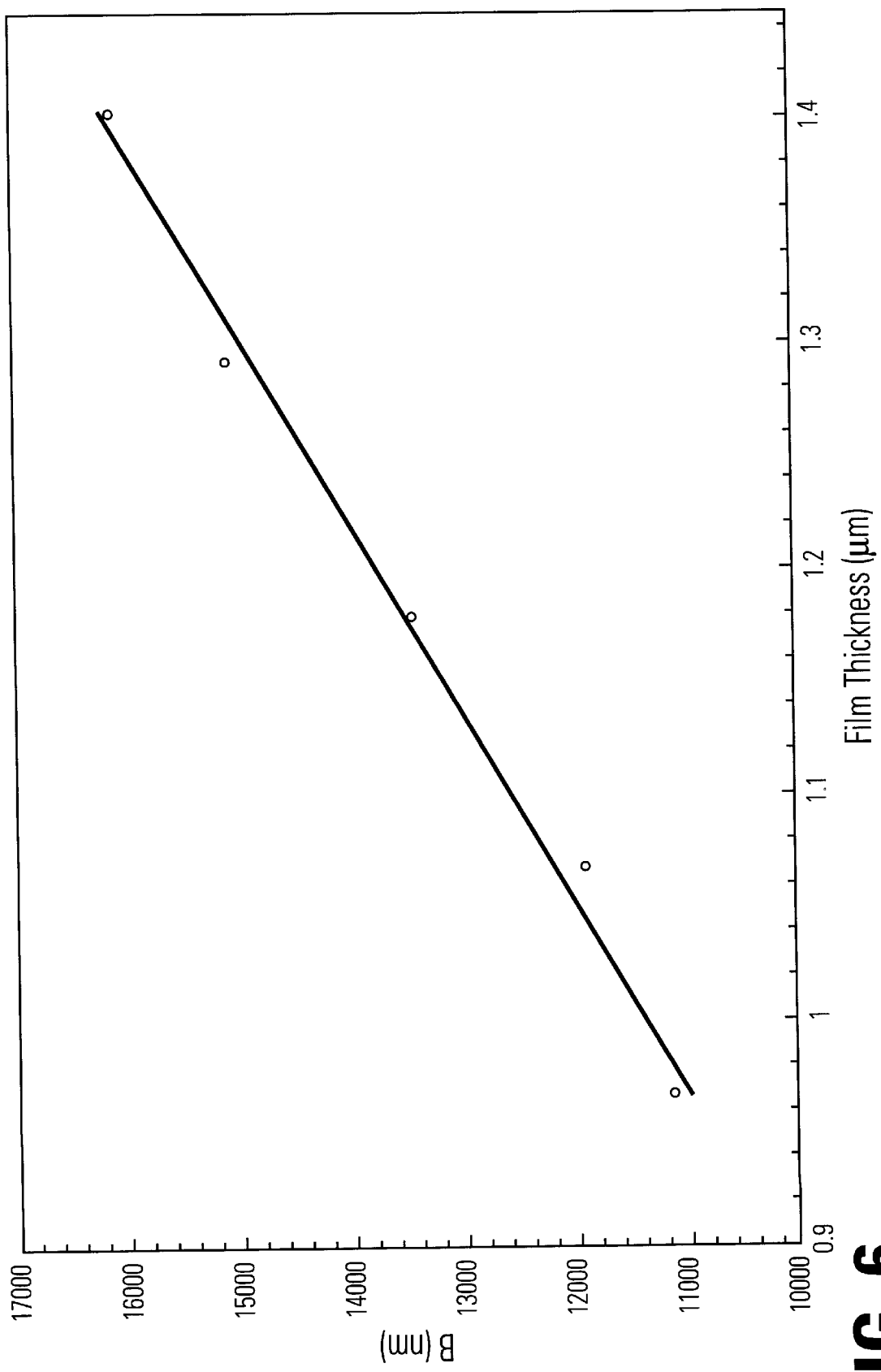
FIG. 6 is a graph correlating film thickness with a measured oscillatory reflectivity pattern wherein the graph is generated in accordance with the present claimed invention.

With reference next to FIG. 6, a graph correlating film thickness with the measured oscillatory reflectivity pattern is shown. Once the correlation is completed, given the oscillatory pattern of electromagnetic radiation reflected from a periodically patterned thin film, calculator 46 of FIG. 5 is able to calculates the thickness of a periodically patterned layer. Thus, the present invention determines the thickness of a periodically patterned layer without requiring knowledge or calculation of the refractive indices of the thin film or an underlying substrate. Hence, the present invention is able to quickly determine the thickness of a periodically patterned layer by measuring a reflectivity pattern and using a previously determined correlation between thickness and reflectivity. As a result, the present thin film thickness measuring system reduces required user calculations thereby reducing the chance that a user error will occur, and also reducing the time needed to measure the thickness of a periodically patterned layer.

Furthermore, as stated above, it is well known that the thickness of an unpatterned semitransparent layer is related to measured reflectivity as a function of wavelength, λ, by the Fresnel reflection formula:

$$R = \frac{r'^2 + r''^2 + 2r'r''\cos(4\pi n_1 t_1 / \lambda)}{1 + r'^2 + r''^2 + 2r'r''\cos(4\pi n_1 t_1 / \lambda)}$$

where:
$$r' = \frac{n_1 - n_{Air}}{n_1 + n_2}$$
$$r'' = \frac{n_2 - n_1}{n_2 + n_1}$$

Thus, the present invention is also well suited to determining optical characteristics such as the index of refraction of a periodically patterned layer once the thickness of the periodically patterned layer has been calculated.

In another embodiment, the present invention is well suited to determining the optimal focus for a lithographic manufacturing apparatus. In such an embodiment, a first periodic pattern is formed using a lithographic semiconductor manufacturing apparatus set at a first focal length. A second periodic pattern is then formed using the lithographic semiconductor manufacturing apparatus set at a second focal length. In the present embodiment, the first and second periodic patterns are resist lines. Although such periodic patterns are used in the present embodiment, the present invention is also well suited to the formation of numerous other periodic patterns or features well known in the art. Furthermore, the first focal length setting used in the present embodiment is comprised of a recommended or expected optimal focal length setting. The second focal length setting is comprised of a setting which is varied slightly from the recommended or expected optimal focal length. The present invention is well suited to varying the first and/or second focal length settings to values which are closer to or farther from the recommended or expected optimal focal length. Although only two periodic patterns are formed using two respective focal length settings in the present embodiment, the present invention is also well suited to forming more than two periodic patterns using more than two respective focal settings.

Next, both the first periodic pattern and the second periodic pattern are impinged with electromagnetic radiation having a wavelength which varies within a wavelength range. In the present embodiment, the electromagnetic radiation is selected to have a wavelength which is highly absorptive by the material comprising the first and second periodic pattern. In the present embodiment, the first and second periodic patterns are formed of resist having novolak-diazonaphthoquinone inhibitor chemistry. As a result, the first and second periodic patterns are highly absorptive of electromagnetic radiation having a wavelength in the deep ultraviolet (DUV) range due to the phenolic nature of the resist's backbone. As mentioned above, for purposes of the present application, the DUV range is defined as electromagnetic radiation having a wavelength less than 300 nanometers. In the present embodiment, a DUV generating electromagnetic source such as a deuterium lamp is used to impinge the first and second periodic patterns with electromagnetic radiation. Although, a DUV absorptive resist is used to form the first and second periodic patterns in the present embodiment, the present invention is also well suited to the use of other types of resist or materials which are absorptive at other wavelengths. In instances where the first and second periodic patterns are absorptive at other wavelengths, an electromagnetic radiation source which produces a wavelength which will be absorbed is used.

Figure 7:
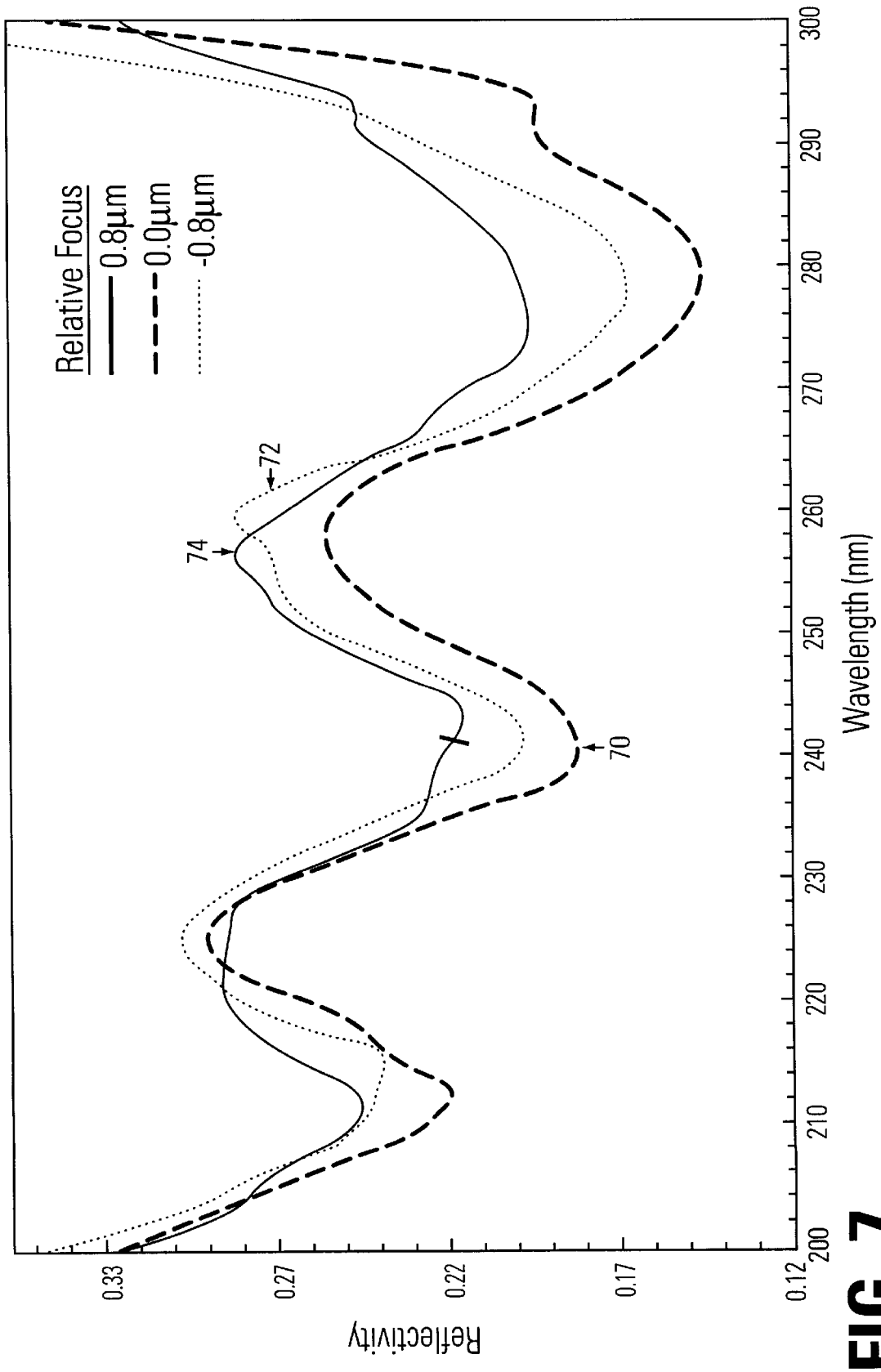
FIG. 7 is a graph showing reflectivity versus the wavelength of impinging DUV light for three periodic patterns formed using a lithographic semiconductor manufacturing apparatus set at a three different focal lengths in accordance with the present claimed invention.

Referring next to FIG. 7, a graph showing reflectivity versus the wavelength of impinging DUV light for three periodic patterns is shown. The first periodic pattern is formed using a lithographic semiconductor manufacturing apparatus set at a first focal length, the second periodic pattern was formed using the lithographic semiconductor manufacturing apparatus set at a second focal length, and the third periodic pattern was formed using a lithographic semiconductor manufacturing apparatus set at a third focal length. As shown in FIG. 7, in the present invention, an oscillatory reflectivity pattern is recorded for each of the periodic patterns. An oscillatory reflectivity pattern 70 is reflected from the first periodic pattern, an, oscillatory reflectivity pattern 72 is reflected from the second periodic patter, and an oscillatory reflectivity pattern 74 is reflected from the third periodic pattern. In the present embodiment, oscillatory reflectivity pattern 70 corresponds to a supplier recommended or expected optimal focal length setting. Oscillatory reflectivity pattern 72 corresponds to a focal length setting which 0.6 microns shorter than a supplier recommended or expected optimal focal length setting. Oscillatory reflectivity pattern 74 corresponds to a focal length setting which 0.9 microns longer than a supplier recommended or expected optimal focal length setting. Although such focal length setting and variations are used in the present embodiment, the present invention is also well suited to the use of various other focal length settings and variations.

Next, the present invention employs any one or more of numerous well known comparators, not shown, to compare the measured oscillatory reflectivity patterns. In the present embodiment, the minima of each of the oscillatory reflectivity patterns are compared to determine which focal settings results in the lowest minima. The focal length setting which results in the lowest minima is then used as the optimal focal length. That is, those periodic patterns which have been formed at an optimal focal setting have the greatest resolution. The greater resolution of the periodic pattern results in a lower minima in the oscillatory reflectivity pattern corresponding to the periodic pattern. Hence, by using numerous focal length setting covering a wide range of focal lengths, the present invention allows a user to objectively and precisely determine which focal length optimizes the formation of features formed by the lithographic semiconductor manufacturing apparatus. Although the minima of the measured oscillatory reflectivity patterns are used in the present embodiment, the present invention is also well suited to using other portions of the measured oscillatory reflectivity pattern to determine which focal length is the optimal focal length. That is, the present invention determines the relationship between reflectivity and focus setting. The relationship of reflectivity to focus setting can vary based on characteristics of the periodic pattern. More specifically, the line width of the periodic pattern will vary depending upon exposure conditions used in defocusing and based on the material composition of the periodic pattern. For example, line widths of some materials will increase with defocus while line widths in other materials will decrease with defocus. Additionally, although the present invention employs a comparator, the present invention is also well suited to the use of other comparison approaches such as, for example, modeling of the reflectivity response to the focus of the substantially opaque layer.

By measuring optimal focus, the present invention provides additional insight into the optical characteristics of the operating system. For example, the present invention allows for an analysis of any astigmatism present in the operating system. It will be understood by those of ordinary skill in the art that the present invention also provides information into other optical characteristics of the operating system as well.

Thus, the present invention provides a thin film thickness measuring system which does not require the user to know or calculate the refractive indices of the thin film or an underlying layer; and a focal length measuring system which allows for objectively and consistently selecting an optimal focal length.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. A method for determining the optimal focal length to be used in a semiconductor manufacturing process, the method comprising the steps of:

a) forming a first periodic pattern using a lithographic semiconductor manufacturing apparatus, said lithographic semiconductor manufacturing apparatus set at a first focal length;

b) forming a second periodic pattern using said lithographic semiconductor manufacturing apparatus wherein said lithographic semiconductor manufacturing apparatus is set at a second focal length during formation of said second periodic pattern, said second focal length being different than said first focal length of step a) such that said second periodic pattern is different from said first periodic pattern, said second periodic pattern having the same period as said first periodic patterns;

c) impinging said first periodic pattern with electromagnetic radiation having a wavelength which varies within a wavelength range;

d) measuring said electromagnetic radiation reflected from said first periodic pattern;

e) impinging said second periodic pattern with said electromagnetic radiation having a wavelength which varies within said wavelength range;

f) measuring said electromagnetic radiation reflected from said second periodic pattern;

g) comparing said measured reflectance of said electromagnetic radiation from said first periodic pattern with said measured reflectance of said electromagnetic radiation from said second periodic pattern; and h) using said comparison of said measured reflectance of said electromagnetic radiation from said first and second periodic patterns to determine which of said first and second focal lengths optimizes the formation of features formed by said lithographic semiconductor manufacturing apparatus.

2. The method for determining the optimal focal length to be used in a semiconductor manufacturing process as recited in claim 1 wherein step a) further comprises forming a first periodic pattern of photoresist lines on a substrate.

3. The method for determining the optimal focal length to be used in a semiconductor manufacturing process as recited in claim 1 wherein step b) further comprises forming a second periodic pattern of photoresist lines on a substrate.

4. The method for determining the optimal focal length to be used in a semiconductor manufacturing process as recited in claim 1 wherein step c) further comprises impinging said first periodic pattern with ultraviolet light.

5. The method for determining the optimal focal length to be used in a semiconductor manufacturing process as recited in claim 1 wherein step e) further comprises impinging said second periodic pattern with ultraviolet light.

6. The method for determining the optimal focal length to be used in a semiconductor manufacturing process as recited in claim 2 wherein said step of impinging a first periodic pattern with ultraviolet light further comprises impinging said first periodic pattern with deep ultraviolet light.

7. The method for determining the optimal focal length to be used in a semiconductor manufacturing process as recited in claim 3 wherein said step of impinging a second periodic pattern with ultraviolet light further comprises impinging said second periodic pattern with deep ultraviolet light.

8. The method for determining the optimal focal length to be used in a semiconductor manufacturing process as recited in claim 1 wherein step g) further comprises comparing a measured sinusoidal reflectance intensity pattern for said first periodic pattern with a measured sinusoidal reflectance intensity pattern for said second periodic pattern.

9. The method for determining the optimal focal length to be used in semiconductor manufacturing process as recited in claim 8 wherein said step of comparing a measured sinusoidal reflectance intensity pattern for said first periodic pattern with a measured sinusoidal reflectance intensity pattern for said second periodic pattern further comprises comparing minima of said sinusoidal reflectance intensity pattern for said first periodic pattern with minima of said sinusoidal reflectance intensity pattern for said second periodic pattern.

10. The method for determining the optimal focal length to be used in a semiconductor manufacturing process as recited in claim 9 wherein said step of using said comparison of said measured reflectance of said electromagnetic radiation from said first and second periodic patterns to determine which of said first and second focal lengths optimizes the formation of features formed by said lithographic semiconductor manufacturing apparatus further comprises determining which of said first and second focal lengths is the optimal focal length by measuring which of said first and second focal lengths results in the lowest minima for said first and second sinusoidal reflectance intensity patterns.

* * * * *